United States Patent [19]

Lee et al.

[11] Patent Number: 5,424,993
[45] Date of Patent: Jun. 13, 1995

[54] PROGRAMMING METHOD FOR THE SELECTIVE HEALING OF OVER-ERASED CELLS ON A FLASH ERASABLE PROGRAMMABLE READ-ONLY MEMORY DEVICE

[75] Inventors: Roger R. Lee; Fernando Gonzalez, both of Boise, Id.

[73] Assignee: Micron Technology, Inc., Boise, Id.

[21] Appl. No.: 152,809

[22] Filed: Nov. 15, 1993

[51] Int. Cl.$^6$ .............................................. G11C 7/00
[52] U.S. Cl. ..................................... 365/218; 365/185; 365/201; 365/900
[58] Field of Search ............... 365/218, 200, 201, 185, 365/900

[56] References Cited

U.S. PATENT DOCUMENTS

| | | | |
|---|---|---|---|
| 4,279,024 | 7/1981 | Schrenk | 365/185 |
| 5,163,021 | 11/1992 | Mehrotra et al. | 365/201 |
| 5,232,535 | 8/1993 | Mielke | 365/218 |
| 5,233,562 | 8/1993 | Ong et al. | 365/201 |
| 5,272,669 | 12/1993 | Samachisa et al. | 365/218 |
| 5,335,198 | 8/1994 | Van Buskirk et al. | 365/185 |

OTHER PUBLICATIONS

Yamada et al., "A Self-Convergence Erasing Scheme For A Simple Stacked Gate Flash EEPROM", IEDM Sep. 1991, pp. 307-310.

Kazerounlan et al., "A 5 Volt High Density Poly-Poly Erase Flash EPROM Cell", IEDM Aug. 1988, pp. 436-439.

Primary Examiner—Joseph A. Popek
Assistant Examiner—Tan Nguyen
Attorney, Agent, or Firm—Kevin D. Martin

[57] ABSTRACT

A programming method for flash erasable programmable memory devices (flash EPROMs) comprises a first step of erasing the array of cells, then applying a control gate voltage to access a number of control gates. Any number of control gates can be accessed, but accessing four or eight control gates may have advantages. Regardless of the number of control gates accessed, a digit line voltage is applied to access one of the digit lines, which activates a number of cells. The digit line voltage is sensed for a voltage drop, which indicates the presence of at least one over-erased activated cell. If a digit line voltage drop is detected, a sense voltage is applied to each of the activated cells to determine which is over-erased. A heal voltage is applied to the over-erased cell for an interval of time to store electrons on the floating gate of the over-erased cell. The sense voltage is applied to the over-erased cell to determine if the cell remains over-erased, and if the cell remains over-erased the heal voltage is again applied to the over-erased cell. The sense voltage is then applied to the over-erased cell to determine if it remains over-erased.

42 Claims, 3 Drawing Sheets

| | DRAIN | SOURCE | CONTROL GATE |
|---|---|---|---|
| READ CELL | 1.0 V | TEST | 5.0 V |
| PROGRAM CELL | 6.0 V | 0.0 V | 12.0 V |
| ERASE CELL | FLOAT | 11.0 V | 0.0 V |
| SENSE CELL | 7.0 V (TEST FOR VOLTAGE DROP) | 0.0 V | FLOAT |
| HEAL CELL | 5.0 V | 0.0 V | 5.0 V |

|  | DRAIN | SOURCE | CONTROL GATE |
|---|---|---|---|
| READ CELL | 1.0 V | TEST | 5.0 V |
| PROGRAM CELL | 6.0 V | 0.0 V | 12.0 V |
| ERASE CELL | FLOAT | 11.0 V | 0.0 V |
| SENSE CELL | 7.0 V (TEST FOR VOLTAGE DROP) | 0.0 V | FLOAT |
| HEAL CELL | 5.0 V | 0.0 V | 5.0 V |

PROGRAMMING METHOD FOR THE SELECTIVE HEALING OF OVER-ERASED CELLS ON A FLASH ERASABLE PROGRAMMABLE READ-ONLY MEMORY DEVICE

FIELD OF THE INVENTION

This invention relates, in general, to programmable read-only memory devices and, more particularly, to programming methods for programmable read-only memories.

BACKGROUND OF THE INVENTION

Erasable Programmable Read-only Memories (EPROMs), Electrically Erasable Programmable Read-only Memories (E²PROMs), and Flash E²PROMs (hereafter collectively, PROMs) have several structures which allow them to hold a charge without refresh for extended periods of time. FIG. 1 shows a top view of a PROM array, FIG. 2 shows a cross section along "AA" of FIG. 1, and FIG. 3 shows a cross section along "BB" of FIG. 1. The charge itself is stored on a "floating gate" 10 also referred to as Poly 1 or P1, which is a structure of polycrystalline silicon (hereafter, poly) surrounded on all sides by a layer of oxide 12. Located superjacent and parallel to this P1 structure is another poly structure, the "control gate" 14 or P2. P1 10 and P2 14 act as the two plates of a capacitor. Below the P1 layer are two N+ junctions, one which acts as the transistor source 16 and the other as the drain 18, which are doped into a P-type substrate 20. The portion of the substrate 20 between the source 16 and the drain 18 is the channel 22. The cell functions like an enhancement-type N-channel metal oxide semiconductor field effect transistor (MOSFET) with two gates of poly.

There are structures that make up a PROM array which are common to several transistors in the array. FIG. 1 shows the transistor sources 16, drains 18, digit lines 24, floating gates 10, and control or "word" lines 26 which form control gates 14 as they pass over the floating gates 10. Also shown as a dotted line is the "active area" 28 interspersed with areas of field oxide 30. A single word line 26 is common to all transistors in a single column acting as a control gate 14 for all transistors in the column. When the word line is selected it activates all transistors in the column. The source regions 16, which run parallel with the control lines 26, are common to all transistors in two adjacent columns. Individual transistor drains 18 are common to two transistors in adjacent columns. The digit (or bit) lines 24 are common with the drains 18 of all transistors in a single row.

The voltage potential which must be applied on the control gate to turn on the transistor is much higher in a device storing a charge (for example, storing −5V) than in a device which does not have a potential stored on P1. To read the content of the floating gate, the source is tied to ground while the drain (by way of its digit line) is tied to a voltage, for example +1V. A potential somewhere between the low and high potential values of the cell (i.e. the select voltage), for example +5V, is applied to the control gate. A cell that does not conduct when the select voltage is applied to the control gate has a negative charge stored on P1, while a cell which does not have a negative charge stored on P1 will conduct heavily.

There are many ways to program a PROM. In one technique, a potential such as 12V, for example, is applied on the control gate. Simultaneously, a voltage pulse, for example 6V, is applied between source and drain. The large positive potential on the control gate establishes an electric field in the insulating oxide. This electric field generates the so-called "hot electron injection" of the transistor due to the high drain and control gate potentials, and injects the hot electrons into the floating gate. In this way the floating gate is charged, and the charge that accumulates on the floating gate becomes trapped.

Another programming method is by Fowler-Nordheim tunneling. By applying a high potential on the word line and grounding the source and/or the drain, electrons will tunnel through the thin gate oxide to the floating gate. Fowler-Nordheim tunneling is critically determined by the potential between the control gate and the source and/or drain (and therefore the electric field) and the thickness of the gate oxide.

To return the floating gate from a charged state to a state with no charge (erase), the electrons are caused to return to the substrate. In an EPROM, this is accomplished with ultraviolet light which excites the electrons past a certain energy state, thereby allowing them to pass through the oxide and return to the substrate. In an E²PROM, this excitation is accomplished with an electrical field, for example by applying 11V to the source and 0V to the control gate while the drain is allowed to float. After erase, a device can be reprogrammed by placing a charge on those cells requiring a charge, and the remaining cells are not programmed.

One problem that can occur with floating gate devices is over-erase. Over-erase can occur when an excessive number of electrons stored on the floating gate of a programmed cell are removed, for example during a normal erase procedure. This can occur if the gate oxide under the floating gate is too thin, thereby decreasing the resistance to the flow of electrons through the gate oxide. Other mechanisms for over-erase are not yet known, however over-erase can be unpredictable and can be random from cell to cell. One cause of random over-erase may be the movement of holes through the gate oxide which makes the movement of electrons from the floating gate to the substrate during erase more efficient. Regardless of the cause of the over-erase, an over-erased cell will have a positively charged floating gate which can shift the threshold voltage close to 0.0V or, in extreme cases, to a negative voltage.

A method of programming a cell which corrects an over-erased cell would be desirable.

SUMMARY OF THE INVENTION

The invention comprises a programming method for erasable programmable memory devices (EPROMs). An EPROM device comprises an array of cells, and each cell has a control gate, a floating gate, a drain region, a source region, and a digit line coupled with the drain. The inventive method begins by erasing the array of cells, then applying a control gate voltage to access a number of the control gates. Any number of control gates can be accessed, but accessing four or eight control gates may have advantages. Regardless of the number of control gates accessed, a digit line voltage is applied to access one of the digit lines, which activates a number of cells. The digit line voltage is sensed for a voltage drop, which indicates the presence of at least one over-erased activated cell. If a digit line voltage drop is detected, a sense voltage is applied to each of the activated cells to determine which is over-erased. A heal voltage is applied to the over-erased cell for an interval of time to store electrons on the floating gate of the over-erased cell. The sense voltage is applied to the over-erased cell to determine if the cell remains over-erased, and if the cell remains over-erased the heal voltage is again applied to the over-erased cell. The sense voltage is then applied to the over-erased cell to determine if it remains over-erased.

Various objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
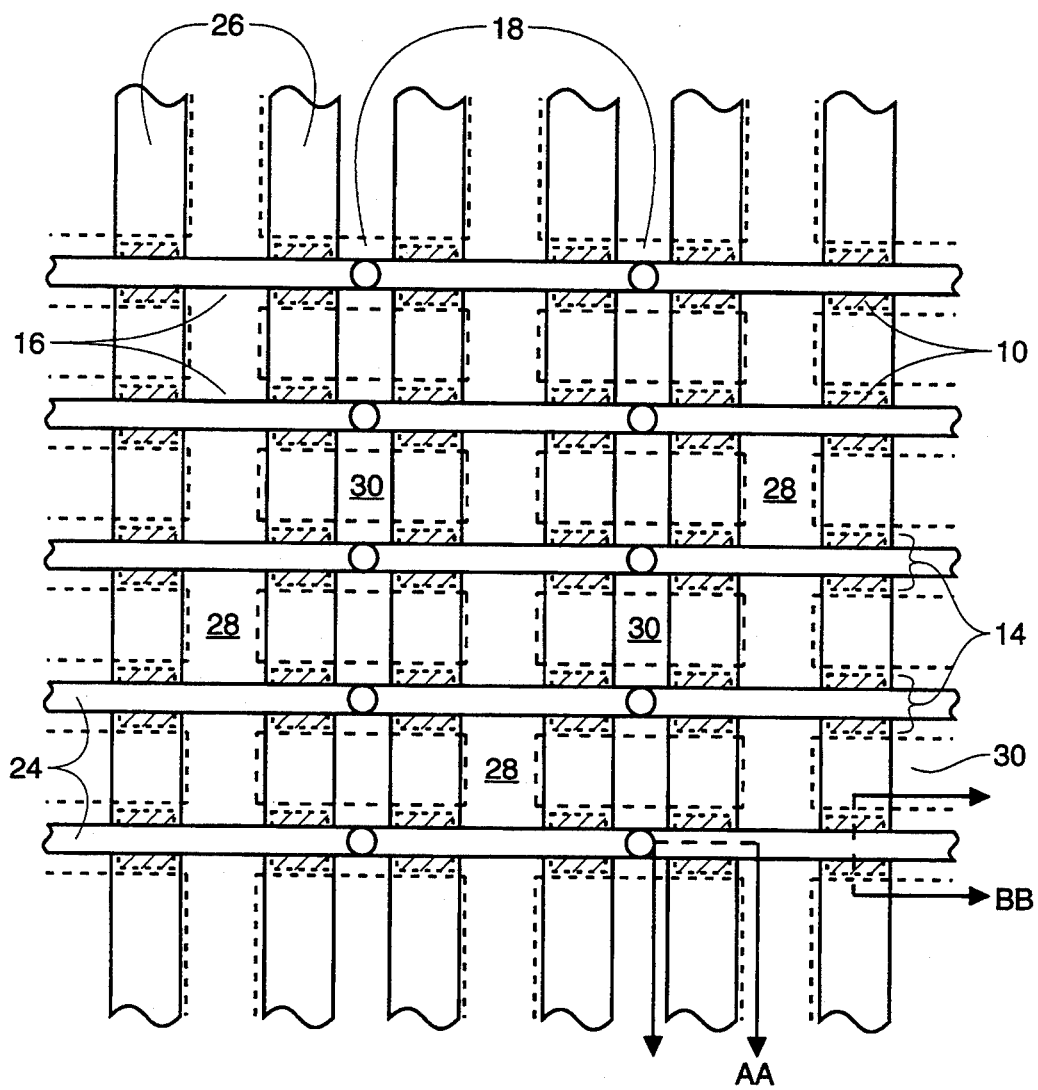
FIG. 1 is a top view of a PROM array.
Figure 2:
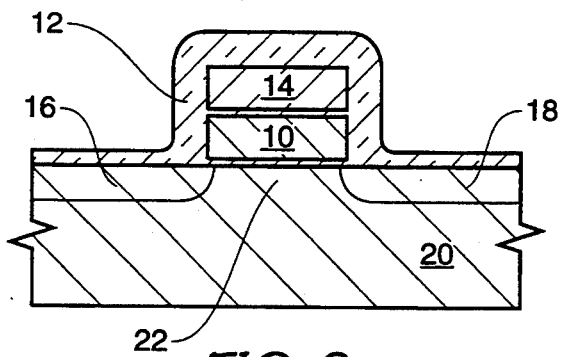
FIG. 2 is a cross section of the FIG. 1 PROM array along section "AA"
Figure 3:
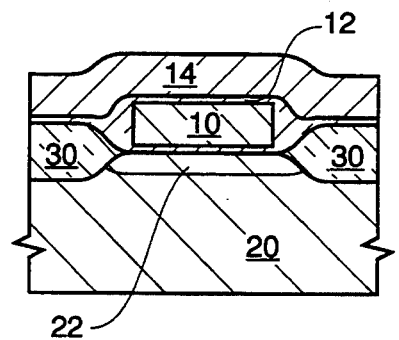
FIG. 3 is a cross section of the FIG. 1 PROM array along section "BB"
Figure 4:
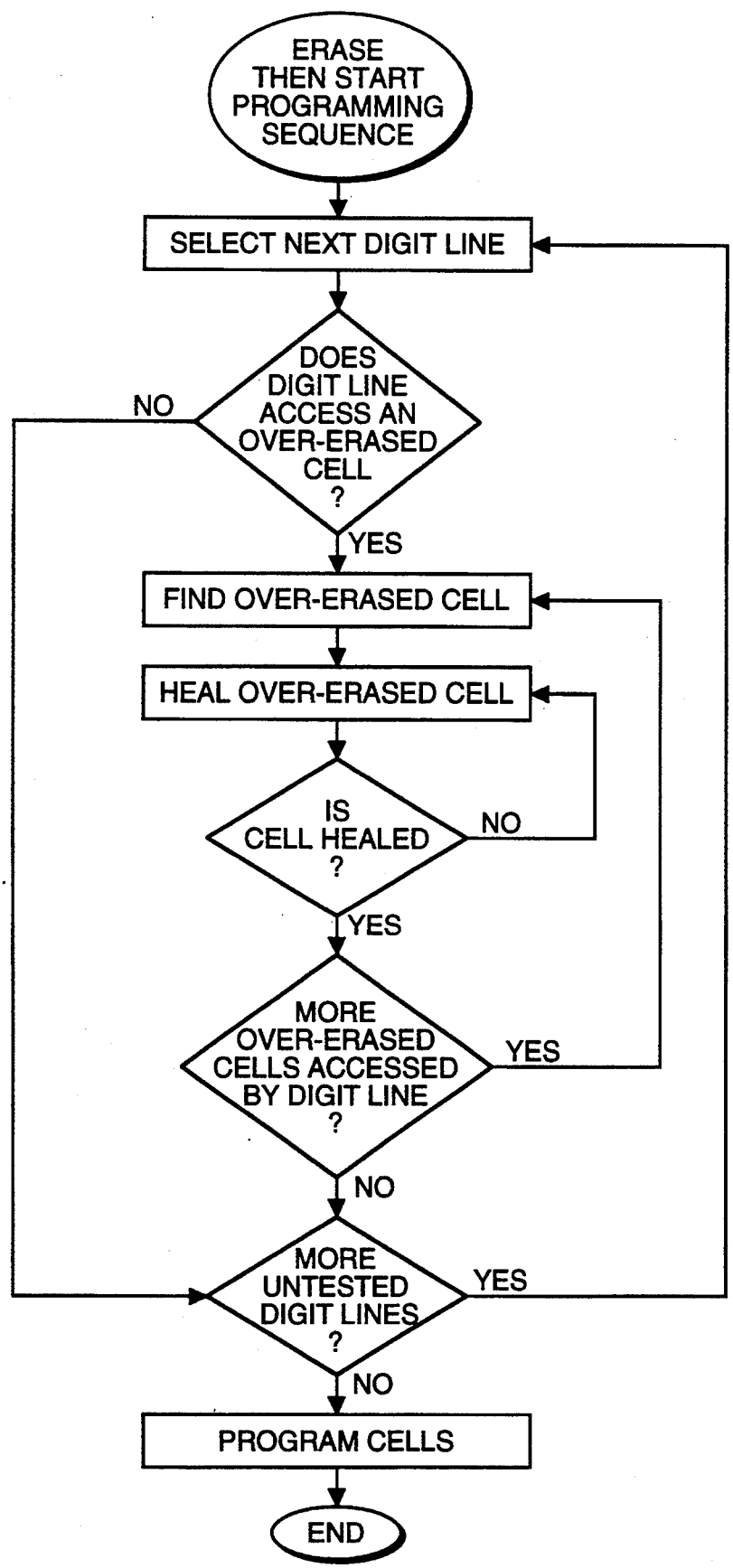
FIG. 4 is a flow chart showing one possible embodiment of the inventive method.

FIG. 4 is a flow chart showing the steps comprising the invention. After all cells are erased the programming sequence is started. Each digit line is sequentially selected, and it is determined if the digit line accesses any over-erased cells. All cells accessed by the digit line can be activated by first accessing all control gates and then accessing the digit line. As this would require a large amount of current, it may be more beneficial to first access less than all the control gates before accessing the digit line. For example, four control gates (a word) or eight control gates (a byte) could be accessed, then the digit line is accessed to determine if any of the eight activated cells are over-erased. The next eight control gates are then accessed, and the same digit line is accessed to activate a second group of eight cells accessed by that digit line. The flow chart shown in FIG. 4 and the text below describe the simultaneous activation of all cells accessed by one digit line, but they are easily modified by one of ordinary skill in the art to select a reduced number of cells, for example eight.

If the digit line voltage $V_D$ is 0V, no activated over-erased cells are accessed by the digit line and the next digit line (or the next group of cells) is tested. If $V_D$ is positive, then at least one activated cell is over-erased. If an over-erased cell is activated, a "sense" voltage $V_{SENSE}$ is applied to each activated cell to determine if the cell is storing a positive voltage. $V_{SENSE}$ can be any voltage that would not turn on a cell storing 0V but would turn on a cell storing a positive voltage. For example, applying 7V to the drain, 0V to the source, and allowing the control gate to float would turn on a cell storing a positive voltage, but would not turn on a cell storing 0V. The 7V on the drain is sensed, for example by a current sense amp. If the voltage on the drain does not drop the cell being sensed is not over-erased and the next activated cell accessed by the digit line is sensed. If the voltage on the drain drops (from being shorted through the cell to ground) the activated cell being tested is over-erased.

Once the over-erased cell is found, a "heal" voltage $V_H$ is applied to the cell. $V_H$ injects hot electrons onto the floating gate to counteract the positive voltage, but does not bias the floating gate enough to cause a negative charge to build on the floating gate. $V_H$ is applied only for a timed period, for example one microsecond to one millisecond. An example of the $V_H$ is to apply 5V to the drain and to the control gate, and 0V to the source. Other voltages may be used which do bias the floating gate can be used, as timing $V_H$ ensures that very little negative voltage, if any, is stored on the floating gate. After $V_H$ is applied to the over-erased cell for the timed interval, $V_{SENSE}$ is reapplied to the cell to determine if it is healed. If the cell is still over-erased, $V_H$ is reapplied to the cell, then $V_{SENSE}$ is applied to the cell.

Once the over-erased cell is healed, the digit line is again tested to determine if there are additional over-erased activated cells accessed by the digit line. If so, they are healed, and if not the next untested digit line (if any exist) is tested. In any case, after the over-erased cells accessed by a particular digit line are healed the remaining digit lines are tested and the over-erased cells are healed.

After all the digit lines are tested and the over-erased cells are healed, the cells are programmed, for example by applying 6.0V to the drain, 0.0V to the source, and 12.0V to the control gate. Other programming voltages are well known in the art.

Figures 5, 6:
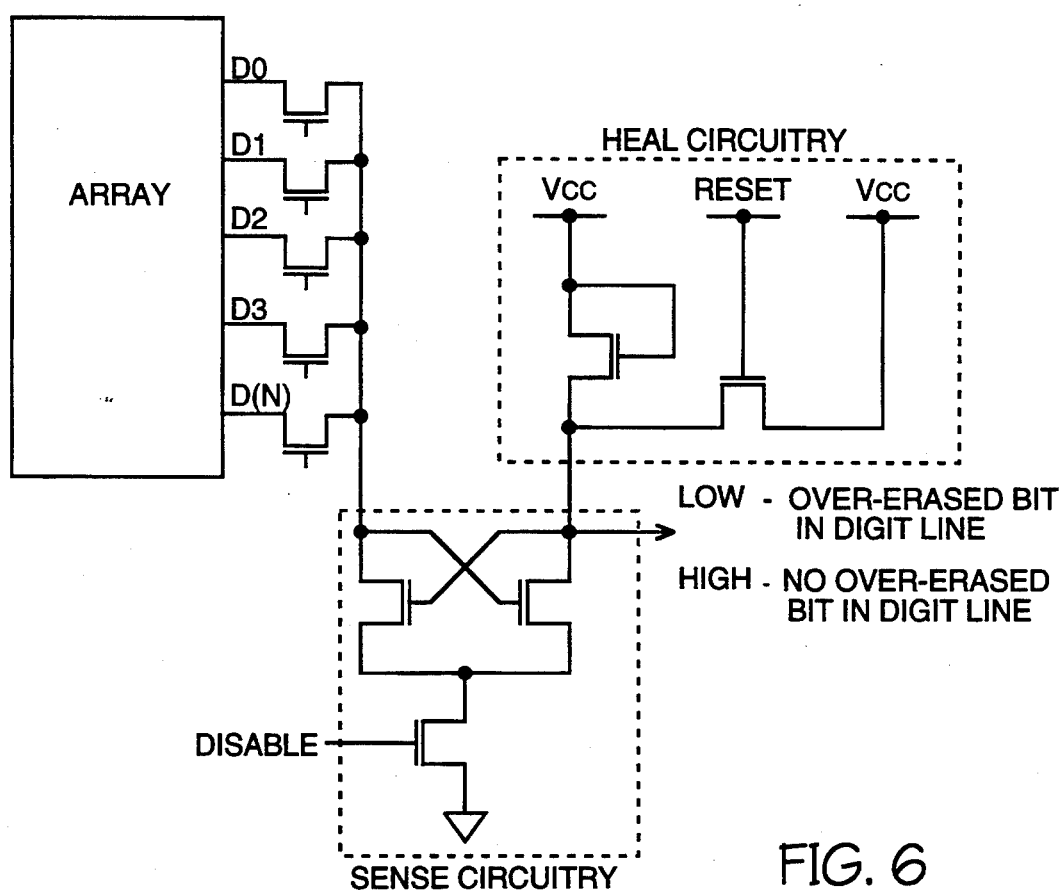
FIG. 5 is a table showing possible voltages associated with a flash PROM cell and with the inventive method.
FIG. 6 is one possible circuit for applying the inventive method to a PROM cell.

FIG. 5 shows a table of the various voltages associated with different modes of operation with a PROM cell such as a flash memory device. Various other voltages may function equally well. For example, the voltages will be different with a 3.3V flash PROM design, and other voltages would function equally well with a 5V design.

FIG. 6 shows a circuit which can carry out the heal and sense modes. The circuit can be formed on the device itself or in logic off the device. Other circuits which carry out the operation as described are possible and likely.

With the inventive programming method, only those cells which are over-erased are healed. This is in contrast to a heal mode which applies a heal voltage to every cell without testing to determine if it is over-erased. Thus the inventive method as described reduces the current required to repair the cells over a method which heals all cells regardless of whether they are over-erased. Also, each digit line (or a byte of activated cells accessed by a digit line) is checked to determine if it accesses an over-erased bit. Very little time is added onto the programming sequence since in a typical array the majority of bits are not over-erased. Checking each digit line rather than each individual cell further reduces the test time. Finally, as each cell is healed individually, the voltage variation of the healed cells is reduced over a process which heals all cells simultaneously.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method for programming an erasable programmable read-only memory device, the device comprising an array of cells, each cell having a control gate, a floating gate, a drain region, a source region, and a digit line coupled with the drain, said method comprising the following steps:
   a) erasing said array of programmable read-only memory cells;
   b) accessing a number of said control gates;
   c) accessing one of said digit lines, thereby activating said number of said cells;
   d) sensing the presence of at least one over-erased activated cell;
   e) detecting which activated cell is over-erased by applying 7.0 volts to said drain of said over-erased cell, 0.0 volts to said source of said over-erased cell, and testing said accessed digit line for a voltage drop;
   f) storing electrons on said floating gate of said over-erased cell;
   g) determining whether said over-erased cell remains over-erased;
   h) responsive to said over-erased cell remaining over-erased, repeating steps f) and g).

2. The method of claim 1, further comprising the steps of:
   a) accessing said number previously unaccessed control gates;
   b) accessing said one of said digit lines, thereby activating said number previously unactivated cells;
   c) sensing the presence of at least one over-erased activated cell.

3. The method of claim 1, wherein electrons are stored on said floating gate of said over-erased cell by applying 5.0 volts to said drain and said control gate of said over-erased cell, and applying 0.0 volts to said source of said over-erased cell.

4. The method of claim 1 wherein four control gates are accessed and four cells are activated.

5. The method of claim 1 wherein said voltages are applied to said drain and said source for a timed interval.

6. The method of claim 5 wherein said timed interval is between about one microsecond and one millisecond.

7. The method of claim 1, wherein said over-erased cell is detected by applying 7.0V to said drain of said over-erased cell, 0.0V to said source of said over-erased cell, and testing said accessed digit line for a current change.

8. The method of claim 1 wherein at least eight control gates are accessed and eight cells are activated.

9. The method of claim 1 wherein all cells accessed by said digit line are activated during step c).

10. The method of claim 1 wherein said method is performed on a flash erasable programmable read-only memory device.

11. The method of claim 1, further comprising the step of allowing said control gate to float during said detection of said over-erased cell.

12. A method for programming an erasable programmable read-only memory device, the device comprising an array of cells, each cell having a control gate, a floating gate, a drain region, a source region, and a digit line coupled with the drain, said method comprising the following steps:
   a) erasing said array of programmable read-only memory cells;
   b) applying a control gate voltage to access a number of said control gates;
   c) applying a digit line voltage to access one of said digit lines, thereby activating said number of said cells;
   d) sensing said digit line voltage for a digit line voltage drop by applying 7.0 volts to said drain of said over-erased cell and 0.0 volts to said source of said over-erased cell, said digit line voltage drop indicating the presence of at least one over-erased activated cell;
   e) responsive to said digit line voltage drop, applying a sense voltage to each of said activated cells to determine which is over-erased;
   f) applying a heal voltage to said over-erased cell for an interval of time to store electrons on said floating gate of said over-erased cell;
   g) applying said sense voltage to said over-erased cell to determine if said over-erased cell remains over-erased;
   h) responsive to said over-erased cell remaining over-erased, repeating steps f) and g).

13. The method of claim 12, wherein said heal voltage comprises applying 5.0 volts to said drain and said control gate of said over-erased cell, and applying 0.0 volts to said source of said over-erased cell.

14. The method of claim 12, further comprising the steps of:
   a) applying said control gate voltage to access said number of previously unaccessed control gates;
   b) accessing said one of said digit lines, thereby activating said number of previously unactivated cells;
   c) repeating step d).

15. The method of claim 12 wherein said timed interval is between about one microsecond and one millisecond.

16. The method of claim 12 further comprising the following steps:
   a) responsive to the absence of a digit line voltage drop, in step d), applying said control gate voltage to said number of previously unaccessed control gates thereby accessing said control gates;
   b) accessing said one of said digit lines, thereby activating said number of previously unactivated cells;
   c) sensing said digit line voltage for a digit line voltage drop, said digit line voltage drop indicating the presence of at least one over-erased activated cell;
   d) responsive to a digit line voltage drop, applying a sense voltage to each of said activated cells to determine which is over-erased;
   e) applying a heal voltage to said over-erased cell for an interval of time to store electrons on said floating gate of said over-erased cell;
   f) applying said sense voltage to said over-erased cell to determine if said over-erased cell remains over-erased;
   g) responsive to said over-erased cell remaining over-erased, repeating steps e) and f).

17. The method of claim 12 wherein four control gates are accessed and four cells are activated.

18. The method of claim 12 wherein eight control gates are accessed and eight cells are activated.

19. The method of claim 12 wherein the number of cells activated during step c) equals the number of cells accessed by said digit line.

20. The method of claim 11, wherein said method is performed on a flash erasable programmable read-only memory device.

21. The method of claim 12, wherein said sense voltage further comprises allowing said control gate to float.

22. A method for programming a flash erasable programmable read-only memory device, the device comprising an array of cells, each cell having a control gate, a floating gate, a drain region, a source region, and a digit line coupled with the drain, said method comprising the following steps:
   a) erasing said array of programmable read-only memory cells;
   b) applying a control gate voltage to access eight of said control gates;
   c) applying a digit line voltage to access one of said digit lines, thereby activating eight of said cells;
   d) sensing said digit line voltage for a digit line voltage drop, said digit line voltage drop indicating the presence of at least one over-erased activated cell;
   e) responsive to said digit line voltage drop, applying a sense voltage to each of said activated cells to determine which is over-erased, said sense voltage including the application of 7.0 volts to said drain of said over-erased cell, 0.0 volts to said source of said over-erased cell, and allowing said control gate to float;
   f) applying a heal voltage to said over-erased cell for between one microsecond and one millisecond to store electrons on said floating gate of said over-erased cell, said heal voltage including the application of 5.0 volts to said drain and said control gate of said over-erased cell, and 0.0V to said source of said over-erased cell;
   g) applying said sense voltage to said over-erased cell to determine if said over-erased cell remains over-erased;
   h) responsive to said over-erased cell remaining over-erased, repeating steps f) and g).

23. A method for programming an erasable programmable read-only memory device, the device comprising an array of cells, each cell having a control gate, a floating gate, a drain region, a source region, and a digit line coupled with the drain, said method comprising the following steps:
   a) erasing said array of programmable read-only memory cells;
   b) accessing a number of said control gates;
   c) accessing one of said digit lines, thereby activating said number of said cells;
   d) sensing the presence of at least one over-erased activated cell;
   e) detecting which activated cell is over-erased;
   f) storing electrons on said floating gate of said over-erased cell by applying 5.0 volts to said drain and said control gate of said over-erased cell, and applying 0.0 volts to said source of said over-erased cell;
   g) determining whether said over-erased cell remains over-erased;
   h) responsive to said over-erased cell remaining over-erased, repeating steps f) and g).

24. The method of claim 23, further comprising the steps of:
   a) accessing said number of previously unaccessed control gates;
   b) accessing said one of said digit lines, thereby activating said number of previously unactivated cells;
   c) sensing the presence of at least one over-erased activated cell.

25. The method of claim 23, wherein said over-erased cell is detected by applying 7.0 volts to said drain of said over-erased cell, 0.0 volts to said source of said over-erased cell, and testing said accessed digit line for a voltage drop.

26. The method of claim 25, further comprising the step of allowing said control gate to float during said detection of said over-erased cell.

27. The method of claim 25 wherein said voltages are applied to said drain and said source for a timed interval.

28. The method of claim 27 wherein said timed interval is between about one microsecond and one millisecond.

29. The method of claim 23 wherein at least four control gates are accessed and four cells are activated.

30. The method of claim 27 wherein at least eight control gates are accessed and eight cells are activated.

31. The method of claim 23 wherein all cells accessed by said digit line are activated during step c).

32. The method of claim 23 wherein said method is performed on a flash erasable programmable read-only memory device.

33. A method for programming an erasable programmable read-only memory device, the device comprising an array of cells, each cell having a control gate, a floating gate, a drain region, a source region, and a digit line coupled with the drain, said method comprising the following steps:
   a) erasing said array of programmable read-only memory cells;
   b) applying a control gate voltage to access a number of said control gates;
   c) applying a digit line voltage to access one of said digit lines, thereby activating said number of said cells;
   d) sensing said digit line voltage for a digit line voltage drop, said digit line voltage drop indicating the presence of at least one over-erased activated cell;
   e) responsive to said digit line voltage drop, applying a sense voltage to each of said activated cells to determine which is over-erased;
   f) applying a heal voltage to said over-erased cell for an interval of time to store electrons on said floating gate of said over-erased cell, wherein said heal voltage comprises applying 5.0 volts to said drain and said control gate of said over-erased cell, and applying 0.0 volts to said source of said over-erased cell;
   g) applying said sense voltage to said over-erased cell to determine if said over-erased cell remains over-erased;
   h) responsive to said over-erased cell remaining over-erased, repeating steps f) and g).

34. The method of claim 33, further comprising the steps of:
   a) applying said control gate voltage to access said number of previously unaccessed control gates;
   b) accessing said one of said digit lines, thereby activating said number of previously unactivated cells;

c) repeating step d).

35. The method of claim 33, wherein said sense voltage comprises applying 7.0 volts to said drain of said over-erased cell and 0.0 volts to said source of said over-erased cell.

36. The method of claim 35, further comprising the step of allowing said control gate to float during said detection of said over-erased cell.

37. The method of claim 33 wherein said timed interval is between about one microsecond and one millisecond.

38. The method of claim 33, further comprising the following steps:
   a) responsive to the absence of a digit line voltage drop, in step d), applying said control gate voltage to said number of previously unaccessed control gates thereby accessing said control gates;
   b) accessing said one of said digit lines, thereby activating said number of previously unactivated cells;
   c) sensing said digit line voltage for a digit line voltage drop, said digit line voltage drop indicating the presence of at least one over-erased activated cell;
   d) responsive to a digit line voltage drop, applying a sense voltage to each of said activated cells to determine which is over-erased;
   e) applying a heal voltage to said over-erased cell for an interval of time to store electrons on said floating gate of said over-erased cell;
   f) applying said sense voltage to said over-erased cell to determine if said over-erased cell remains over-erased;
   g) responsive to said over-erased cell remaining over-erased, repeating steps e) and f).

39. The method of claim 337 wherein four control gates are accessed and four cells are activated.

40. The method of claim 33 wherein eight control gates are accessed and eight cells are activated.

41. The method of claim 33 wherein said number of cells activated during step c) equals the number of cells accessed by said digit line.

42. The method of claim 33, wherein said method is performed on a flash erasable programmable read-only memory device.

* * * * *